(12) United States Patent
Voarino et al.

(10) Patent No.: US 11,908,964 B2
(45) Date of Patent: Feb. 20, 2024

(54) METHOD FOR FABRICATING AND INSPECTING A PHOTOVOLTAIC ASSEMBLY WITH PARTIAL CROSSLINKING

(71) Applicant: COMMISSARIAT A L'ENERGIE ATOMIQUE ET AUX ENERGIES ALTERNATIVES, Paris (FR)

(72) Inventors: Philippe Voarino, Grenoble (FR); Romain Cariou, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 85 days.

(21) Appl. No.: 17/785,322

(22) PCT Filed: Nov. 12, 2020

(86) PCT No.: PCT/FR2020/052059
§ 371 (c)(1),
(2) Date: Jun. 14, 2022

(87) PCT Pub. No.: WO2021/123524
PCT Pub. Date: Jun. 24, 2021

(65) Prior Publication Data
US 2023/0006079 A1    Jan. 5, 2023

(30) Foreign Application Priority Data
Dec. 16, 2019 (FR) ...................................... 1914470

(51) Int. Cl.
*H01L 31/048* (2014.01)
*H01L 31/18* (2006.01)
*H01L 21/66* (2006.01)

(52) U.S. Cl.
CPC ............ *H01L 31/048* (2013.01); *H01L 22/12* (2013.01)

(58) Field of Classification Search
CPC .................................................... H01L 31/048
See application file for complete search history.

(56) References Cited

U.S. PATENT DOCUMENTS 4,170,507 A * 10/1979 Keeling ................ H01L 31/048
136/251
2010/0240153 A1 * 9/2010 Tabe ..................... H01L 31/188
438/4

FOREIGN PATENT DOCUMENTS

EP   2 166 576 A2   3/2010
JP   2002-26358 A   1/2002

OTHER PUBLICATIONS

International Search Report dated May 14, 2021, in PCT/FR2020/052059 filed Nov. 12, 2020, 2 pages.
(Continued)

*Primary Examiner* — Jayne L Mershon
(74) *Attorney, Agent, or Firm* — Oblon, McClelland, Maier & Neustadt, L.L.P.

(57) ABSTRACT

A method is provided for fabricating and inspecting a photovoltaic assembly including a base, at least one photovoltaic module, and at least one adhesion layer based on a crosslinkable polymer material. The method includes depositing the at least one adhesion layer on the base; an assembly step; a partial crosslinking step; an electrical connection step; inspecting for mechanical and electrical functioning; in the event of correct functioning being detected, a crosslinking finalization step; in the event of incorrect functioning being detected removing at least one defective photovoltaic module.

18 Claims, 4 Drawing Sheets

(56) References Cited

OTHER PUBLICATIONS

French Preliminary Search Report dated Aug. 31, 2020, in French Application No. 1914470 filed Dec. 16, 2019, (with English Translation of Categories of Cited Documents), 2 pages.

* cited by examiner

METHOD FOR FABRICATING AND INSPECTING A PHOTOVOLTAIC ASSEMBLY WITH PARTIAL CROSSLINKING

TECHNICAL FIELD

The present invention relates to the field of photovoltaic modules, which include a set of photovoltaic cells electrically connected to one another, and preferably so-called "crystalline" photovoltaic cells, that is to say that are based on monocrystalline or multicrystalline silicon, of materials III-V, of thin layers (CIGS, CdTE, perovskites, etc.) or any combination of these various materials. In particular, the invention is concerned by the problem of bonding/encapsulation and detachment/separation of photovoltaic modules in relation to a base in contact with the photovoltaic modules.

The invention concerns the field of photovoltaic modules used for space applications, but also for terrestrial applications, and also for electronic mobility type applications, balloons or drones, etc. More generally, the invention applies to photovoltaic applications for which the problem of bonding, detaching, repairing and/or recycling is relevant.

The invention thus proposes a method for fabricating and inspecting a photovoltaic assembly with a partial crosslinking step.

PRIOR ART

A terrestrial photovoltaic module conventionally consists of photovoltaic cells electrically connected to one another, generally in a series, and encapsulated in a stack of materials of the polymer and/or glass type. This stack makes it possible to protect the photovoltaic cells from the external environment, such as for example from rain, wind, snow, humidity, ultraviolet rays, radiation, thermal shocks, etc., while maintaining the photoelectric conversion function.

Thus, conventionally, a terrestrial photovoltaic module forms a stack successively including: a rear protective element called "backsheet", transparent or not; a first polymer film, generally of ethylene vinyl acetate (EVA); photovoltaic cells electrically connected to one another, typically by tin-plated copper strips; a second polymer film, generally of ethylene vinyl acetate (EVA); a front protective element called "frontsheet", transparent, such as for example a glass plate or a polymer film.

The front protective element is intended to transmit the solar radiation to the photovoltaic cells to generate electricity, while protecting them from the constraints of the environment. This stack is then secured during a hot lamination step, typically between 100 and 150° C., to melt the EVA films and perform the crosslinking of the molten EVA, hence the result is the formation of a solid encapsulation envelope of the photovoltaic cells bonded to the front and rear protective elements.

During the lamination step, the crosslinking of the encapsulant is irreversible and makes it possible to obtain a compact unit. The photovoltaic modules thus obtained cannot be repaired, namely that the various layers of materials and the photovoltaic assemblies cannot be delaminated, therefore separated, and easily replaced in the event of defect or for recycling. Thus, the separation of materials at end of life for this type of terrestrial photovoltaic module is destructive, and grinding and filtering steps are necessary.

Moreover, a conventional space photovoltaic module consists of assemblies of photovoltaic cells bonded on a rigid substrate of the honeycomb type. The structure and the type of photovoltaic cells used differ from terrestrial photovoltaic modules in order to adapt to the environmental constraints and drastic techniques of space (radiation, temperatures, vacuum, etc.). Thus, each photovoltaic cell is protected by an individual glass in the front face, secured by means of a transparent adhesive to the cell, so as to form a unit called CIC for "Coverglass Interconnect Cell". This CIC unit is permanently bonded on the substrate or mechanical base by means of an adhesive. From the generations of solar panels under development, some replace the CIC with a cell assembly, therefore a module, which itself is bonded on a mechanical base.

The adhesives used, typically based on silicone, offer a good resistance to the space environment but do not enable easy detachment in the event of a need for repair or recycling. In addition, during the control steps before placing in orbit, for example during an electroluminescence test, the photovoltaic assemblies and cells identified as defective are manually and mechanically detached at the crosslinked adhesive, the most often mechanically with the aid of a scalpel. Yet, the base or the layers of materials in contact may have mechanical, electrical (transfer of signals, of electrical power, insulation, etc.) functions and/or protective functions in relation to the external environment that are deteriorated by this manual detachment operation.

The American patent U.S. Pat. No. 7,998,760 B2 proposes the use of a conductive adhesive to establish an electrical contact between a solar cell and a conductive strip. The bonding is performed in a first temperature and pressure condition, followed by a step of inspecting the electrical quality of the cell and of the connection formed. In the event of defect after inspection, the cells may be detached in order to be replaced. This patent focuses on the connection portion and does not deal with the portion relating to the encapsulation and to the bonding on a substrate.

Moreover, the Japanese patent application JP 2002-026358 A teaches the improvement of the local reparability of a solar module thanks to the use of a thermoplastic resin for sealing the module with a phase change at around 190° C. The invention relates to the defects related to the handling of solar modules, such as scratches and impacts resulting in a rupture of hermeticity. The phase change of the encapsulant, locally on the heating area, may help to correct these defects. No teaching relates to the complete change of solar cells in the event of breakage.

DESCRIPTION OF THE INVENTION

The aim of the invention is to remedy at least partially the needs mentioned above and the drawbacks relating to the embodiments of the prior art.

In particular, the aim of the invention is to be able to fabricate a photovoltaic assembly comprising one or more photovoltaic modules on a base, and to check the correct functioning of the photovoltaic module(s) by inspection in order to perform a possible repair operation of the assembly.

Thus, the object of the invention, according to one of its aspects, is a method for fabricating and inspecting a photovoltaic assembly, including:
- a base,
- at least one photovoltaic module, comprising at least one photovoltaic cell, particularly a plurality of photovoltaic cells electrically connected to one another and disposed side by side, between a first transparent layer forming a front face of said at least one photovoltaic module and the base,
- at least one adhesion layer based on a crosslinkable polymer material, disposed between the base and said at least one photovoltaic module, characterised in that it includes the following steps:

a step A) of depositing said at least one adhesion layer on the base, a step B) of assembling said at least one photovoltaic module on the base covered by said at least one adhesion layer, a partial crosslinking, also called pre-crosslinking, step C), namely advantageously performed prior to a crosslinking finalisation step so as to obtain a temporary and/or reversible adhesion, of said at least one adhesion layer based on a crosslinkable polymer material to form at least one partially crosslinked adhesion layer, having an adhesive power allowing a subsequent removal of said at least one photovoltaic module if necessary, particularly during step G) described below, an electrical connection step D) consisting in electrically connecting said at least one photovoltaic module to electrical connection means of the base, a step E) of inspecting the mechanical and electrical functioning of said at least one photovoltaic module, optionally in relation with the base, in the event of correct functioning being detected at the outcome of step E), a step F) of finalising the crosslinking of said at least one partially crosslinked adhesion layer, in the event of incorrect functioning being detected at the outcome of step E), a step G) of removing at least one defective photovoltaic module, then return to step A) in view of assembling one or more new photovoltaic modules.

"Crosslinkable polymer material" means a polymer material capable of being crosslinked, the state of which may change to a crosslinked state. A crosslinkable polymer material particularly has a degree of crosslinking strictly less than at the freezing point of this polymer material. Particularly, the crosslinkable polymer material is in the liquid state. "Material in the liquid state" means that the material tends to flow due to the low cohesion of the molecules that constitute it. Particularly, the liquid state of the crosslinkable polymer material is such that this crosslinkable polymer material has a viscosity preferably between 0.1 Pa·s and 100 Pa·s, and preferably between 1 Pa·s and 50 Pa·s at a temperature of 25° C. In the present description, the viscosity values are given at atmospheric pressure.

The fabricating method according to the invention may further include one or more of the following features taken alone or according to any possible technical combinations.

Step G) may be followed by step H) of cleaning the base at the location of removal of said at least one defective photovoltaic module before return to step A).

Said at least one adhesion layer based on a crosslinkable polymer material may advantageously be in the liquid state.

Preferably, said at least one photovoltaic module may include a first transparent layer forming a front face of said at least one photovoltaic module, a second layer, or also a substrate, forming a rear face of said at least one photovoltaic module, and a plurality of photovoltaic cells electrically connected to one another and disposed side by side between the first layer and the second layer. In this case, the rear face of the module may be bonded by the adhesion layer to the base, typically in the form of a solar sail.

The base may be rigid or flexible. For example, the base may be rigid and provided for space applications. In particular, the base may include a honeycomb structure, for example made of aluminium. As a variant, the base may be flexible, being for example produced in polyimide, for example a Kapton® film, made of polyetheretherketone (PEEK) or also made of thermoplastic material spun from an aramide, for example a Vectran® film, etc.

Furthermore, the base may be of low thickness. For example, the thickness of the base may be between 10 μm and 5 mm, preferably between 25 and 125 μm.

The technique of depositing said at least one adhesion layer on the base may be variable. It may for example correspond to a coating or spray technique. It is advantageously selected so as not to unnecessarily add mass to the photovoltaic assembly due to an excess of adhesive.

Moreover, in an advantageous way, said at least one adhesion layer is not applied on the whole of the surface of the base. Indeed, the deposition of said at least one adhesion layer is advantageously performed on a portion or on the whole of the surface of the base intended to receive said at least one photovoltaic module.

The thickness of said at least one adhesion layer may be between 10 μm and 1 mm, preferably between 50 μm and 200 μm.

Advantageously, the thickness of said at least one adhesion layer is selected in such a way as to prevent the base and/or said at least one photovoltaic module from being damaged in the event of removal or detachment, to ensure a sufficient adhesion throughout the life of the photovoltaic assembly, and to prevent the unnecessary addition of mass.

Moreover, advantageously, the assembly step B) may precede the partial crosslinking step C). As a variant, the assembly step B) may follow the partial crosslinking step C).

Furthermore, the average crosslinking rate implemented during the partial crosslinking step C) may be between 10% and 60%, particularly between 20% and 50%, by volume or by mass. It should be noted that between the module and the base, some areas may not be crosslinked and others crosslinked at more than 60%.

Advantageously, the crosslinkable polymer material of said at least one adhesion layer may be selected from the silicone family. In particular, it may concern a material of the "UV cure RTV (for "Room Temperature Vulcanisation") silicone" type with a thickness between 10 μm and 1 mm, preferably between 50 μm and 200 μm.

In particular, any crosslinkable polymer material mentioned in the present description may include, particularly consist of, two components A and B. The component A is a base, for example of the PDMS (for polydimethylsiloxane) type. The component B contains a vulcanising agent, such as for example polysiloxane, and a catalyst to make it possible for the polymer chains to ramify in order to form a three-dimensional array so that the crosslinkable polymer material can, at the end of its crosslinking, form a corresponding layer made of solid and infusible material.

The crosslinkable polymer material may be selected from: Sylgard® 184 from the company Dow Corning, Dow Corning® 93-500, Siltech® CR 12-63, Siltech® CR 13-46, Elastosil® RT 625 from the company Wacker, Elastosil® S 691 from the company Wacker, MAPSIOL® 213 from the company MAP COATING, MAPSIL® 213B from the company MAP COATING, and MAPSIL® QSI 123 from the company MAP COATING.

Moreover, step E) of inspecting the mechanical and electrical functioning of said at least one photovoltaic module may comprise performing an electrical test of each set of one or more photovoltaic cells of said at least one photovoltaic module, particularly an electroluminescence, photoluminescence, DIV (Dark IV) type and/or LIV (Light IV) type test, such as described in the standards IEC 60904, EN 61215 and IEC 62108.

Step F) of finalising the crosslinking of said at least one partially crosslinked adhesion layer may further be performed by exposing the photovoltaic assembly to ambient temperature, particularly between 20 and 30° C., for a duration greater than 24 h. As a variant, step F) of finalising the crosslinking of said at least one partially crosslinked adhesion layer may be performed by exposing the photovoltaic assembly to an external energy input, particularly by heating or exposure to infrared and/or ultraviolet waves.

In addition, the crosslinking finalisation step F) may be followed by an additional inspection step E).

The crosslinking finalisation step F) may also be followed by a step of bending the photovoltaic assembly, particularly of a Z-shaped bending.

Similarly, the inspection step E) may be preceded by a step of bending the photovoltaic assembly, particularly of a Z-shaped bending.

Moreover, step C) of partially crosslinking said at least one adhesion layer based on a crosslinkable polymer material may include partially crosslinking the total volume of said at least one adhesion layer.

As a variant, step C) of partially crosslinking said at least one adhesion layer based on a crosslinkable polymer material may include partially crosslinking the total volume of said at least one adhesion layer. In particular, the partial crosslinking may be performed on one or more areas of the surface of said at least one adhesion layer, particularly in the form of one or more patterns, and/or on a portion or the whole of the thickness of said at least one adhesion layer.

BRIEF DESCRIPTION OF THE DRAWINGS

The invention may be better understood upon reading the following detailed description, non-limiting examples of implementation thereof, as well as upon examination of the figures, schematic and partial, of the drawing appended, wherein.

In all of these figures, identical references may designate identical or similar elements.

In addition, the various portions shown in the figures are not necessarily according to a uniform scale, to make the figures more readable.

DETAILED DESCRIPTION OF SPECIFIC EMBODIMENTS

In the description of the following examples of implementation of the invention, the field of application concerned is that of photovoltaic modules for space applications. However, the invention also applies to photovoltaic modules provided for terrestrial applications.

Figure 1:
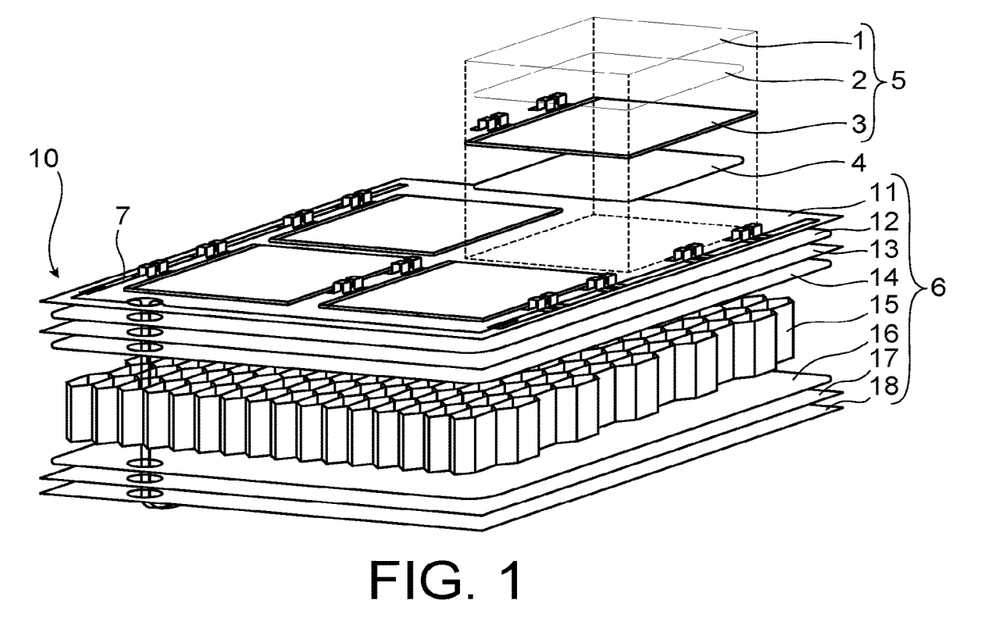
FIG. 1 shows, according to an exploded view in perspective, an example of rigid space photovoltaic module, or assembly.

FIG. 1 illustrates first of all, according to an exploded view in perspective, an example of rigid space photovoltaic module, or assembly 10.

In this example, the photovoltaic assembly 10 includes a rigid base 6 on which a plurality of CIC, for "Coverglass Interconnect Cell", type photovoltaic modules 5 is bonded.

The rigid base 6 successively includes (from top to bottom): an insulating layer 11 on which are bonded the photovoltaic modules 5; an adhesive layer 12; a polymer layer 13; an adhesive layer 14; a honeycomb structure 15; an adhesive layer 16; a polymer layer 17; and a thermal control layer 18.

Moreover, each CIC-type photovoltaic module 5 includes: a front face 1 made of glass; a transparent adhesive layer 2; and one or more photovoltaic cells 3.

An adhesion layer 4 is used between each photovoltaic module 5 and the rigid base 6 to make it possible to attach photovoltaic modules 5 on the rigid base 6 and particularly by means of an adhesion on the layer 11, and thus to fabricate the photovoltaic assembly 10.

Furthermore, the photovoltaic modules 5, once bonded, are electrically connected to electrical connection means 7, particularly electrical harnesses, present on the rigid base 6.

Manual and/or automatic steps, for example of welding, of handling, of bending, etc., are performed on the modules that constitute a risk of deterioration and damage of the photovoltaic modules 5, particularly of breakage.

Yet, for such a photovoltaic assembly 10, in the event of malfunction of one or more of the photovoltaic modules 5, it is necessary to carry out the mechanical detachment of the photovoltaic modules 5 at the adhesion layers 4, which generally results in deteriorations of the photovoltaic modules 5, of the rigid base 6 and/or of the electrical connection means 7, particularly due to the strong adhesion of the adhesion layers 4 between the rigid base 6 and the photovoltaic modules 5.

Figure 2:
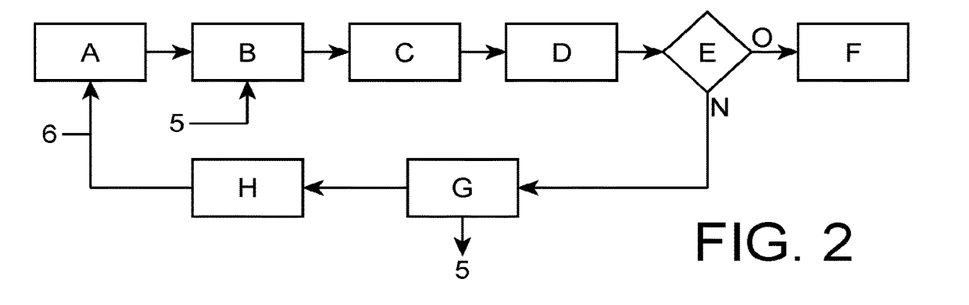
FIG. 2 shows an illustrative block diagram of a method for fabricating a photovoltaic assembly in accordance with the invention.

FIG. 2 shows a block diagram that illustrates an example of implementation of the method for fabricating and inspecting a photovoltaic assembly 10 in accordance with the invention.

The method according to the invention advantageously makes it possible to perform the fabrication and the inspection of a photovoltaic assembly 10, for example of the type of that described in reference to FIG. 1, which comprises a base 6, a plurality of photovoltaic modules 5, each comprising photovoltaic cells 3, and as many liquid adhesion layers 4 based on a crosslinkable polymer material, between the base 6 and each photovoltaic module 5.

Thus, the first step A) of the method consists in performing the deposition of adhesion layers 4 on the base 6. The adhesive thickness may be between 10 µm and 1 mm, particularly between 50 µm and 200 µm.

The base 6 is preferably of low thickness. It may be rigid or flexible. In the case of a space application, it is a rigid base including for example a honeycomb structure, for example made of aluminium.

The technique for depositing on the base 6 may be variable, and correspond for example to a coating or spray deposition. The deposition of adhesive is advantageously performed at locations of the base 6 on which the photovoltaic modules 5 are received. On these locations, the deposition may be total or partial.

The crosslinkable polymer material forming the adhesive is advantageously selected from the silicone family, and may for example be polydimethylsiloxane (PMDS).

It should be noted that the transparent appearance after crosslinking is not necessarily necessary because the useful face of the cells 3 is located in the front face. However, in the case of bifacial cells, it is desirable that the crosslinkable polymer material is transparent.

Subsequently, the method includes a step B) of assembling the photovoltaic modules 5 on the base 6 covered with adhesion layers.

The photovoltaic modules 5 are thus placed on the glued base 6. This assembly is advantageously performed in such a way as to eliminate the bubbles likely to form under the modules 5. Indeed, with the slightest void present in the adhesive (bubble, detached area, etc.), there is a risk of no holding to the void and therefore to the space environment, even if there is a certain tolerance on the size of the bubbles.

At this stage, a step C) of partially crosslinking the liquid adhesion layers 4 based on a crosslinkable polymer material is preferably performed to form partially crosslinked adhesion layers, as seen in FIGS. 5A to 7A subsequently described. In this way, they advantageously have a reversible or non-definitive adhesion force, which allows a subsequent detachment.

It should be noted that as a variant, the partial crosslinking step C) may precede the assembly step B).

The partial crosslinking is preferably performed under an ultraviolet light. As a variant, any other energy input method is possible, for example by infrared, by laser, by exposure to heat, etc.

The partial crosslinking is performed with an average degree or rate of crosslinking between 10% and 60%, preferably between 20% and 50%, by volume or by mass. It should be noted that between the module and the base, some areas may not be crosslinked and others crosslinked at more than 60%. The objective is to create double bonds making it possible to ensure a sufficient mechanical adhesion for the gripping and the handling of the photovoltaic assembly 10. At the outcome of finalising the crosslinking, as subsequently described with step F), the degree of final crosslinking will be greater than 60% on average, or even between 70% and 90%, generally. It should be noted that the crosslinking at 100% is practically never achieved.

The crosslinking rate can be measured by DSC (for "Differential Scanning Calorimeter") method, relative measurement by calculation of the air under the crosslinking peak, following the enthalpy method of the standard IEC 62788 adapted to silicone encapsulants: a scanning is performed at temperature, from 40° C. to 200° C., of a fresh sample of encapsulant. This scanning makes the crosslinking peak appear. By calculating the air under the peak of the curve, the enthalpy of the total crosslinking reaction is obtained, that is to say the energy released by the exothermic crosslinking reaction. When the same measurement and the same calculation is performed for a partially pre-crosslinked sample, the enthalpy value is less than that of the fresh product, since it corresponds to the end of the crosslinking. This is referred to as residual enthalpy. The difference between the two enthalpies gives us the percentage of the crosslinking reaction carried out during the pre-crosslinking.

The crosslinking may be controlled in a plurality of ways: exposure time and luminous power, in addition to the formulation of the adhesive selected. Advantageously, the exposure time will be very short in order to save fabrication time.

Once the partial crosslinking has been finished, an electrical connection step D) consisting in electrically connecting the photovoltaic modules 5 to electrical connection means 7 of the base 6, is implemented. In particular, this step D) makes it possible to perform the welds between the electrical connections exiting photovoltaic modules 5 and an electrical harness 7 of the base 6.

Subsequently, a step E) of inspecting the mechanical and electrical functioning of the photovoltaic modules 5 is implemented.

Indeed, the integrity of the photovoltaic modules 5 must at this stage be checked in order to envisage a possible detachment of one or more photovoltaic modules 5 while the crosslinking is still partial, and therefore before obtaining a total crosslinking that would result in major difficulties of no deterioration in the event of detachment such as according to the practice of the prior art.

This step E) of inspecting the mechanical and electrical functioning of the photovoltaic modules 5 most particularly comprises performing an electrical test of each set of photovoltaic cells 3. Preferably, this electrical test is a DIV (Dark IV) type test. This test may also be accompanied by a visual inspection and/or by an optical characterisation.

It should be noted that, prior to their positioning on the base 6, each photovoltaic module 5 is electrically tested, particularly by the same type of test as that implemented in the inspection step E). However, after the manual and/or automatic operations related to installing the modules 5 on the base 6, a new electrical test that is the subject of this inspection step E) should be carried out.

Thus, in the event of correct functioning being detected at the outcome of step E), symbolised by the reference O in FIG. 2, a step F) of finalising the crosslinking of the partially crosslinked adhesion layers is performed. The photovoltaic modules 5 are therefore maintained on the base 6.

The crosslinking finalisation step F) may be performed by exposing the photovoltaic assembly 10 to ambient temperature, particularly between 20 and 30° C., for a predetermined duration, particularly greater than 24 h, this may depend on the adhesive selected. It is also possible to expose the photovoltaic assembly 10 to an external energy input, particularly by heating or exposure to infrared or ultraviolet waves. It should be noted that the slower the crosslinking is, the more the thermomechanical constraints related to the adhesive will be minimised. However, this crosslinking finalisation step F) may optionally be followed by an additional inspection step E), and if a repair is necessary, it must be done within a fairly short duration, particularly less than 24 h, better less than 12 h.

Figure 3A:
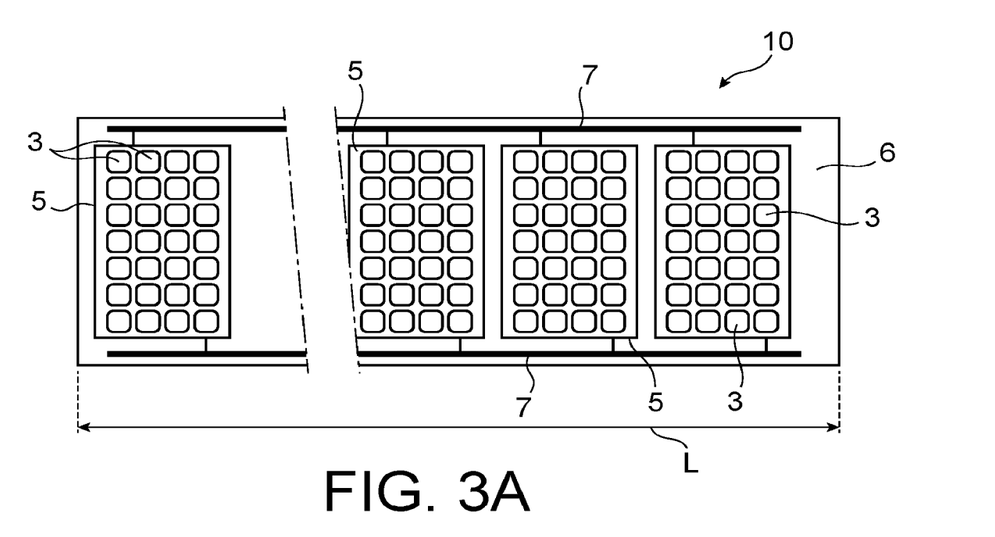
FIG. 3A illustrates, partially in top view, an example of space photovoltaic assembly obtained by the fabrication method in accordance with the invention.
Figure 3B:
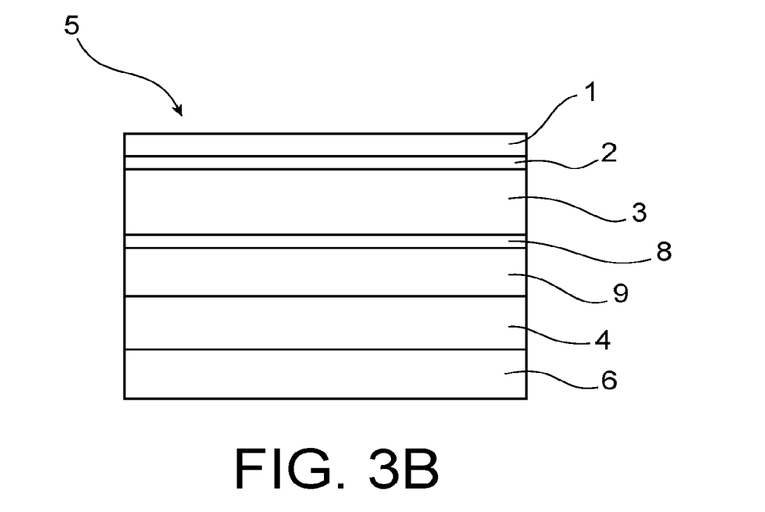
FIG. 3B shows, according to a sectional view, an example of photovoltaic module of the assembly of FIG. 3A

FIG. 3A shows an example of a photovoltaic assembly 10, different from that of FIG. 1, obtained by the implementation of the method described above in reference to FIG. 2. In addition, FIG. 3B shows, according to a sectional view, an example of photovoltaic module 5 of such a photovoltaic assembly 10.

The rigid base 6, forming solar sail, forms the rear face of each photovoltaic module 5. In addition, each photovoltaic module 5 includes: a front face 1 made of glass; a first transparent adhesive layer 2; one or more photovoltaic cells 3; a second transparent adhesive layer 8; a substrate 9 forming the rear face of the module 5.

In addition, an adhesion layer 4 is used between each photovoltaic module 5 and the rigid base 6 to make it possible to attach photovoltaic modules 5 on the rigid base 6, and thus fabricate the photovoltaic assembly 10.

Thus, the photovoltaic module 5 that is bonded on the solar sail or base 6 is of the conventional type with a front face 1 and a rear face 9, which is bonded on the base 6 forming the space sail intended to be bent.

This photovoltaic assembly 10 may have a length L greater than or equal to 5 m, or even 10 m, and comprises a plurality of photovoltaic modules 5, for example at least 30, positioned on the base 6.

Figure 4:
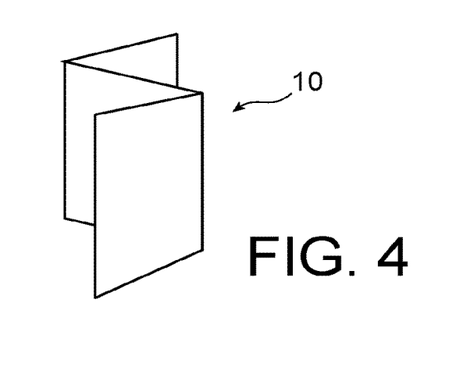
FIG. 4 illustrates, partially in perspective, the bending of the photovoltaic assembly of FIG. 3A, FIGS. 5A, 5B, 5C, 5D and 5E show, according to a top view, various examples of partial crosslinking of an adhesion layer of a photovoltaic assembly during the fabrication method in accordance with the invention.

Then, a step of bending the photovoltaic assembly 10 may be implemented, particularly for obtaining a Z-shaped bending as shown in FIG. 4. However, it should be noted that a bending step may also take place before the inspection step E).

On the other hand, in the event of incorrect functioning being detected at the outcome of step E), symbolised by the reference N in FIG. 2, a step G) of removing one or more defective photovoltaic modules 5, and a step H) of cleaning the base 6 at the location of removal of the defective photovoltaic module(s) 5 are implemented.

An incorrect functioning may for example be: an IV or DARK IV feature with significant parasitic resistance, an electroluminescent image showing cracks or cell breakages, an electroluminescence transient image (or any other technique making it possible to characterise the bonding interface) showing significant bonding defects. The correct functioning is defined as opposed to an incorrect functioning.

Indeed, the photovoltaic module(s) 5 that are considered as incorrect must be detached in order to be replaced. This step may be performed mechanically because the assembly is not definitively attached due to the partial crosslinking. The removal or detachment may thus be performed with the aid of a thin blade of the scalpel type or of other tools making it possible to facilitate this step. The blade is slid under the module(s) 5 in order to carry out the detachment.

This operation is performed so as not to damage the base 6, the risk being of losing the base and the various already bonded and functional photovoltaic modules 5. It should be noted that the lower the degree of crosslinking is, the easier and faster this removal step is. A partial crosslinking therefore makes it possible to reduce the time spent on the repair in the event of noted failure.

The cleaning step H) is provided for its part to remove the adhesive residues not removed by the thin blade. Here again, the lower the degree of crosslinking is, the easier and faster this cleaning step is.

At the outcome of the cleaning step H), the method restarts at step A) for preparing the cleaned area(s) to receive one or more new photovoltaic modules 5.

Step C) of partially crosslinking the liquid adhesion layers 4 based on a crosslinkable polymer material may be envisaged according to various approaches, such as shown for example in FIGS. 5A to 7A.

Figure 5A:
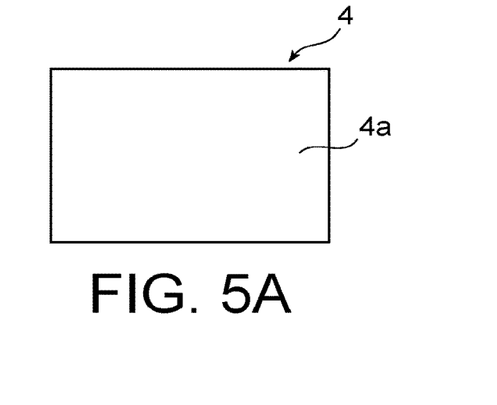

Thus, the partial crosslinking may correspond to a partial crosslinking of the total volume of an adhesion layer 4. In FIG. 5A, the pre-crosslinked area 4a corresponds to the total volume of the adhesion layer 4 that is pre-crosslinked.

As a variant, it is also possible to partially pre-crosslink the volume of an adhesion layer 4, as shown in FIGS. 5B to 7A.

Figure 5B:
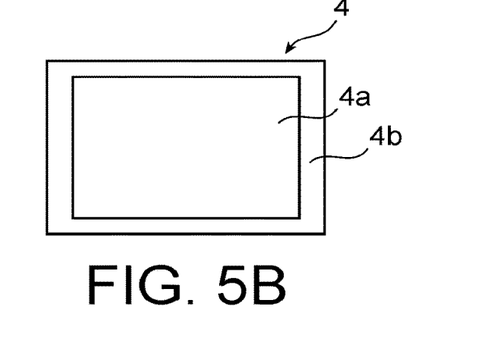
Figure 5C:
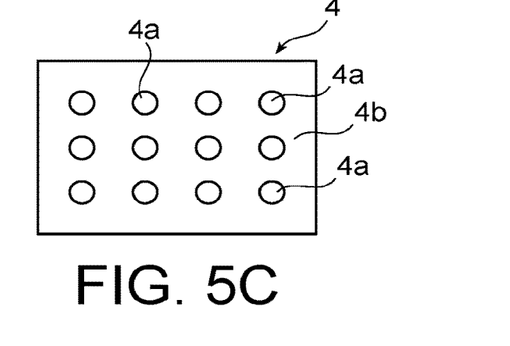

Thus, in FIG. 5B, a central area 4a is pre-crosslinked whereas the periphery of the surface of the adhesion layer 4 comprises a non-crosslinked area 4b. In FIG. 5C, the pre-crosslinked areas 4a are in the form of dots evenly spaced apart from one another, whereas the remainder of the surface of the adhesion layer 4 corresponds to a non-crosslinked area 4b.

Figure 5D:
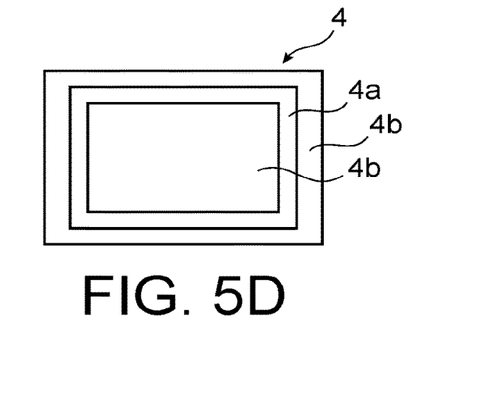
Figure 5E:
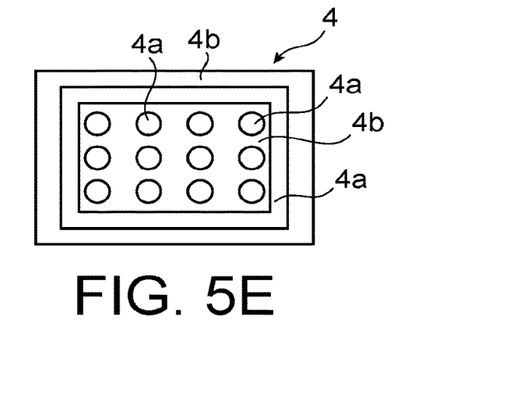

In FIG. 5D, a rectangular box corresponds to a pre-crosslinked area 4a whereas the remainder of the surface of the adhesion layer 4 corresponds to a non-crosslinked area 4b. In FIG. 5E, the patterns of FIGS. 5C and 5D are combined together.

Figure 6A:
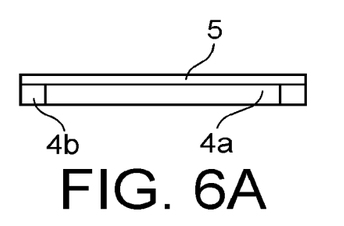
FIGS. 6A and 6B show, according to a side view, various examples of partial crosslinking in thickness for the example of FIG. 5B, and FIGS. 7A and 7B show, according to a side view, an example of partial crosslinking in thickness for the example of FIG. 5C.
Figure 6B:
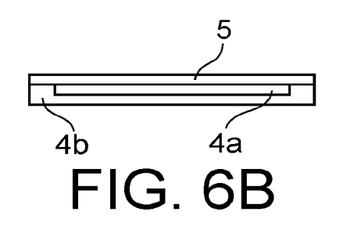

FIGS. 6A and 6B show variations of partial crosslinking in the thickness of the adhesion layer 4 of FIG. 5B. Thus, as in FIG. 6A, the whole of the thickness may be pre-crosslinked. As a variant, one portion only of the thickness is pre-crosslinked, in particular that 4a in contact with the photovoltaic module 5, as seen in FIG. 6B.

Figure 7A:
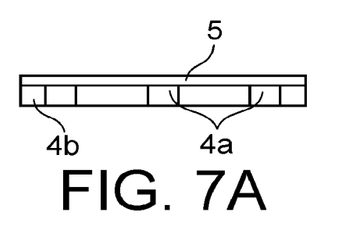
Figure 7B:
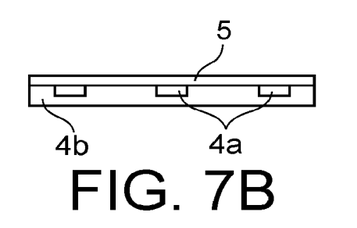

Similarly, FIGS. 7A and 7B show variations of partial crosslinking in the thickness of the adhesion layer 4 of FIG. 5C. Thus, as in FIG. 7A, the whole of the thickness may be pre-crosslinked. As a variant, one portion only of the thickness is pre-crosslinked, in particular that 4a in contact with the photovoltaic module 5, as seen in FIG. 7B.

Thus, the partial crosslinking may correspond to a partial crosslinking of the surface and/or of the volume of an adhesion layer 4, the remaining fraction not being pre-crosslinked. A masking step may thus be implemented by means of masks according to various patterns, for example dots, lines, boxes, etc., in order to obtain the partial crosslinking.

The partial crosslinking may therefore also mean that the degree of crosslinking varies in the thickness of the adhesion layer, with a partial crosslinking performed on the side of the photovoltaic modules 5. Of course, a combination of partial crosslinking in thickness, in pattern and in surface is possible.

Of course, the invention is not limited to the examples of embodiments that have just been described. Miscellaneous modifications may be made by the person skilled in the art.

The invention claimed is:

1. A method for fabricating and inspecting a photovoltaic assembly, including a base, at least one photovoltaic module comprising at least one photovoltaic cell between a first transparent layer forming a front face of said at least one photovoltaic module and the base, and at least one adhesion layer based on a crosslinkable polymer material, disposed between the base and said at least one photovoltaic module, wherein the method comprises:
   a step A) of depositing said at least one adhesion layer on the base,
   a step B) of assembling said at least one photovoltaic module on the base covered by said at least one adhesion layer,
   a step C) of partially crosslinking said at least one adhesion layer based on a crosslinkable polymer material to form at least one partially crosslinked adhesion layer, having an adhesive power allowing a subsequent removal of said at least one photovoltaic module,
   an electrical connection step D) of electrically connecting said at least one photovoltaic module to electrical connection means of the base,
   a step E) of inspecting the mechanical and electrical functioning of said at least one photovoltaic module,
   in the event of correct functioning being detected at an outcome of step E), a step F) of finalizing the crosslinking of said at least one partially crosslinked adhesion layer, and
   in the event of incorrect functioning being detected at the outcome of step E), a step G) of removing at least one defective photovoltaic module, then returning to step A) in view of assembling one or more new photovoltaic modules.

2. The method according to claim 1, wherein the step G) is followed by a step H) of cleaning the base at the location of removal of said at least one defective photovoltaic module before returning to step A).

3. The method according to claim 1, wherein a thickness of said at least one adhesion layer is between 10 μm and 1 mm.

4. The method according to claim 1, wherein the assembly step B) precedes the partial crosslinking step C).

5. The method according to claim 1, wherein the assembly step B) follows the partial crosslinking step C).

6. The method according to claim 1, wherein an average crosslinking rate implemented during the partial crosslinking step C) is between 10% and 60% by volume or by mass.

7. The method according to claim 1, wherein the crosslinkable polymer material of said at least one adhesion layer is selected from the silicone family.

8. The method according to claim 1, wherein the step E) of inspecting the mechanical and electrical functioning of said at least one photovoltaic module comprises performing an electrical test of each set of one or more photovoltaic cells of said at least one photovoltaic module.

9. The method according to claim 1, wherein the step F) of finalizing the crosslinking of said at least one partially crosslinked adhesion layer is performed by exposing the photovoltaic assembly to ambient temperature for a duration greater than 24 hours.

10. The method according to claim 1, wherein the step F) of finalizing the crosslinking of said at least one partially crosslinked adhesion layer is performed by exposing the photovoltaic assembly to an external energy input.

11. The method according to claim 1, wherein the crosslinking finalization step F) is followed by an additional inspection step E).

12. The method according to claim 1, wherein the crosslinking finalization step F) is followed by a step of bending the photovoltaic assembly.

13. The method according to claim 1, wherein the inspection step E) is preceded by a step of bending the photovoltaic assembly.

14. The method according to claim 1, wherein the step C) of partially crosslinking said at least one adhesion layer based on a crosslinkable polymer material includes partially crosslinking a total volume of said at least one adhesion layer.

15. The method according to claim 1, wherein the step C) of partially crosslinking said at least one adhesion layer based on a crosslinkable polymer material includes partially crosslinking a total volume of said at least one adhesion layer.

16. The method according to claim 15, wherein the partial crosslinking is performed on one or more areas of the surface of said at least one adhesion layer and/or on a portion or a whole of the thickness of said at least one adhesion layer.

17. The method according to claim 1, wherein said at least one adhesion layer based on a crosslinkable polymer material is in the liquid state.

18. The method according to claim 1, wherein said at least one photovoltaic module includes a first transparent layer forming a front face of said at least one photovoltaic module, a second layer forming a rear face of said at least one photovoltaic module, and a plurality of photovoltaic cells electrically connected to one another and disposed side by side between the first layer and the second layer.

* * * * *